(12) United States Patent
Klein

(10) Patent No.: US 6,587,363 B2
(45) Date of Patent: Jul. 1, 2003

(54) HIGH SPEED DATA BUS

(75) Inventor: Dean A. Klein, Eagle, ID (US)

(73) Assignee: Micron Electronics, Inc., Nampa, ID (US)

( * ) Notice: Subject to any disclaimer, the term of this patent is extended or adjusted under 35 U.S.C. 154(b) by 0 days.

(21) Appl. No.: 10/017,255

(22) Filed: Dec. 6, 2001

(65) Prior Publication Data

US 2002/0048183 A1 Apr. 25, 2002

Related U.S. Application Data

(62) Division of application No. 09/015,845, filed on Jan. 29, 1998.

(51) Int. Cl.7 .................................................. G11C 5/06
(52) U.S. Cl. ........................ 365/63; 365/51; 365/230.03
(58) Field of Search ........................ 365/63, 51, 230.03

(56) References Cited

U.S. PATENT DOCUMENTS

| | | |
|---|---|---|
| 4,757,215 A | 7/1988 | Seo |
| 5,115,413 A | 5/1992 | Sato et al. |
| 5,148,047 A | 9/1992 | Spohrer |
| 5,260,892 A * | 11/1993 | Testa .......................... 365/63 |
| 5,303,192 A * | 4/1994 | Baba ......................... 365/200 |
| 5,319,595 A | 6/1994 | Saruwatari |
| 5,465,229 A | 11/1995 | Bechtolsheim et al. |
| 5,499,215 A | 3/1996 | Hatta |
| 5,586,076 A | 12/1996 | Miyamoto et al. |
| 5,732,042 A | 3/1998 | Sunaga et al. |
| 5,732,245 A | 3/1998 | Lee et al. |
| 5,802,395 A | 9/1998 | Connolly et al. |
| 5,877,975 A * | 3/1999 | Jigour et al. ................. 365/52 |
| 5,953,215 A | 9/1999 | Karabatsos |
| 5,987,623 A * | 11/1999 | Ushida ......................... 714/6 |
| 6,002,632 A | 12/1999 | Krueger |
| 6,011,710 A | 1/2000 | Wiggers |

* cited by examiner

Primary Examiner—Son T. Dinh
(74) Attorney, Agent, or Firm—Knobbe, Martens, Olson & Bear, LLP

(57) ABSTRACT

The invention comprises data processing systems and components thereof. Such systems may include a memory controller, a plurality of memory devices, a data bus coupling the memory controller with the plurality of memory devices, and at least one bus switch located in the data bus between the memory controller and one of the plurality of memory devices. Memory integrated circuits and memory modules including at least one switch in the data bus are also provided.

17 Claims, 7 Drawing Sheets

HIGH SPEED DATA BUS

RELATED APPLICATIONS

This application is a divisional of, and incorporates by reference in its entirety U.S. application Ser. No. 09/015,845, filed Jan. 29, 1998, titled "HIGH SPEED DATA BUS." This Application is related to and incorporates by reference, in each of their entirety, the following patent applications that each have been filed on even date with same title: U.S. application Ser. No.: 10/021,388; U.S. application Ser. No.: 10/017,826; U.S. application Ser. No.: 10/017,257;and U.S. application Ser. No.: 10/017,256.

BACKGROUND OF THE INVENTION

1. Field of the Invention

The invention relates generally to the field of computing systems. More specifically, the invention relates to creating a high speed data bus between a processor circuit and a memory array.

2. Description of the Related Art

Computing and data processing systems typically include a microprocessor which processes data that it retrieves from a memory circuit. The results of the processing operation are in turn stored back in the memory circuit. The rate at which the microprocessor can perform accesses to the memory to retrieve operands and store results may therefore create a limitation on the speed at which the computing system can perform the tasks it has been programmed to perform.

Several factors are significant in determining the speed at which memory accesses can be performed. There is, for example, an inherent delay between the presentation of row and column addresses to the memory circuit and the time at which the requested data appears at the output of the memory circuit. In many systems, this problem is reduced by the practice of using a small amount of fast access but expensive memory as a cache for frequently used data. Main data storage remains comprised of a large amount of slower, less expensive memory.

Another source of delay is the speed at which signals representative of digital data can be placed on the data bus which couples the microprocessor to the memory circuit. The speed of this data transfer is affected by the parasitic capacitance between each bus line and ground or other low impedance signal. This is because the device which is transferring data by driving the lines of the bus high or low must charge or discharge this parasitic capacitance with each transition, and the time required to accomplish this increases with increasing parasitic capacitance.

This affect has long been recognized and several different ways of addressing it have been developed. In U.S. Pat. No. 5,148,047 to Spohrer, for example, a higher speed bus driver circuit is described which adds a minimal amount of stray capacitance to the bus line. In the specific case of a data bus between a microprocessor and memory, U.S. Pat. Nos. 5,465,229 and 5,260,892 suggest careful routing of data bus traces to minimize bus line capacitance and loading.

In each of these cases, however, the benefits are limited. Altering the driver circuit does not alter the inherent capacitance of the bus lines themselves. Altering bus line routing, although helpful, still leaves bus lines with significant parasitic capacitance. Furthermore, neither of these methods addresses the fact that the bus is loaded with the input capacitance of the memory circuits themselves.

SUMMARY OF THE INVENTION

The invention comprises data processing systems which may include a memory controller, a plurality of memory devices, a data bus coupling the memory controller with the plurality of memory devices, and at least one bus switch located in the data bus between the memory controller and one of the plurality of memory devices.

Components of data processing systems are also provided. In one embodiment, the invention includes a memory integrated circuit comprising a contact which connects to a data bus and a switch, wherein an input portion of the switch is connected to the contact. In another embodiment, the invention includes a memory module comprising a printed circuit board and at least one electrical contact arranged on the printed circuit board to receive digital data. The memory module may also include at least one memory integrated circuit attached to the printed circuit board, and at least one switch having one or more inputs connected to corresponding ones of the one or more electrical contacts, and one or more outputs connected to the memory integrated circuit(s).

DETAILED DESCRIPTION OF THE INVENTION

Embodiments of the invention will now be described with reference to the accompanying Figures, wherein like numerals refer to like elements throughout.

Figure 1:
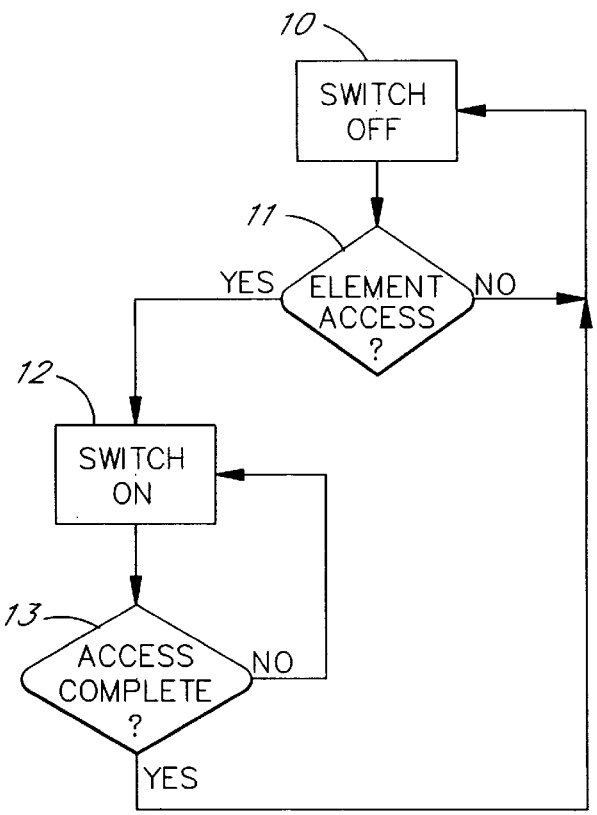
FIG. 1 is a flow chart showing one mode of operation of a computing system which incorporates the invention.

FIG. 1 is an illustration of one operational mode of a system made in accordance with the invention. In this system, one or more switches are associated with memory elements of a computing system. Selective operation of these switches reduces parasitic capacitance of a data bus, and thereby allows increases in the speed data transfer. Thus, operation of a system comprising one or more memory elements may begin at block 10, with a switch associated with a memory element initially in the off state. In this state, the memory element is decoupled from at least one of the buses connecting it to the system processor. As represented by block 11, the computing system monitors whether or not the memory element is being accessed by the host system. If not, the system loops back to block 10, and leaves the switch in the off state. If a memory element access is being made, the system moves instead to block 12, at which point the switch is placed in the on state, thereby connecting the memory element to the portion of the bus it was isolated from.

As illustrated by block 13, once the switch is on, the system monitors whether or not the memory access has been completed. If not, the system continues to leave the switch in the on state. Once the memory access cycle has completed, the system loops back to block 10, and places the switch in the off state. Thus, the system decouples a memory element from a bus when no memory access to or from the selected memory element is being performed. It will be appreciated by those of skill in the art that the switch need not necessarily remain in the on state for the entire duration of any given memory access cycle. It will typically be sufficient to open the switch only during a portion of the memory cycle corresponding to the time during which valid information should be present on the bus which is routed through the switch.

When the memory element is provided on a segment of a data bus which may be decoupled from other data bus segments, this may have the beneficial aspect of reducing the parasitic capacitance of the remainder of the data bus because the particular bus segment and its associated memory element no longer load the remainder of the data bus. In common computer applications, the memory element may be a DRAM memory module. As there are often two, four or perhaps eight memory modules provided, the above described system may decouple all but one of these modules during any given memory access, thereby significantly limiting the capacitive loading on the bus connecting a memory controller to a memory module being accessed.

Figure 2:
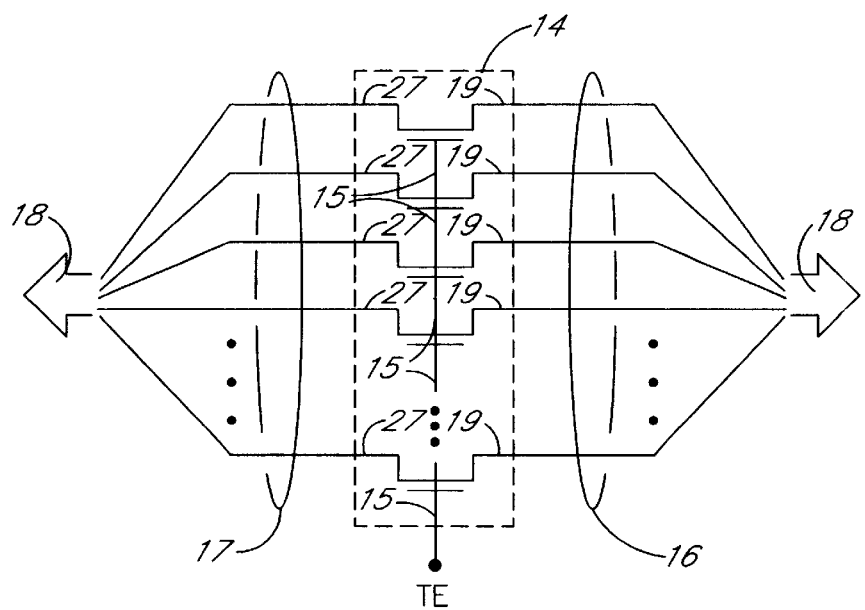
FIG. 2 is a schematic diagram of one embodiment of a switch which may be used in systems which incorporate the invention.

Referring now to FIG. 2, the configuration of one embodiment of a bus switch is illustrated which may be used in a system implementing the mode of operation described above with reference to FIG. 1. In this embodiment, the bus switch 14 comprises one or more n-channel MOSFET transistors with commonly connected gates 15. The switch of FIG. 2 further includes an input portion 16 and an output portion 17, comprising one or more contacts for connection to corresponding one or more lines of a bus 18. It can be appreciated, however, that which side of the switch is considered the "input" and which side is considered the "output" is arbitrary, as data transmission can occur in either direction when the switch is in the on state.

In this switch embodiment, the source 19 of each transistor may be coupled to a corresponding bus line of one segment of the bus 18. The drain 27 of each transistor may be coupled to a corresponding bus line of another segment of the bus 18. The switch 14 therefore decouples or isolates the bus segments when the transistors comprising the switch are in the off state, and couples or connects the bus segments when the transistors comprising the switch are in the on state. The transistors are turned on by asserting the gates 15 via an input "transfer enable" signal line labeled TE in FIG. 2. Bus switch circuits such as that illustrated in FIG. 2 are known to those of skill in the art. Integrated circuit embodiments of such switches are available from, for example, Quality Semiconductor of Santa Clara, Calif., identified as their part numbers QS3384 and QS32384.

Figure 3:
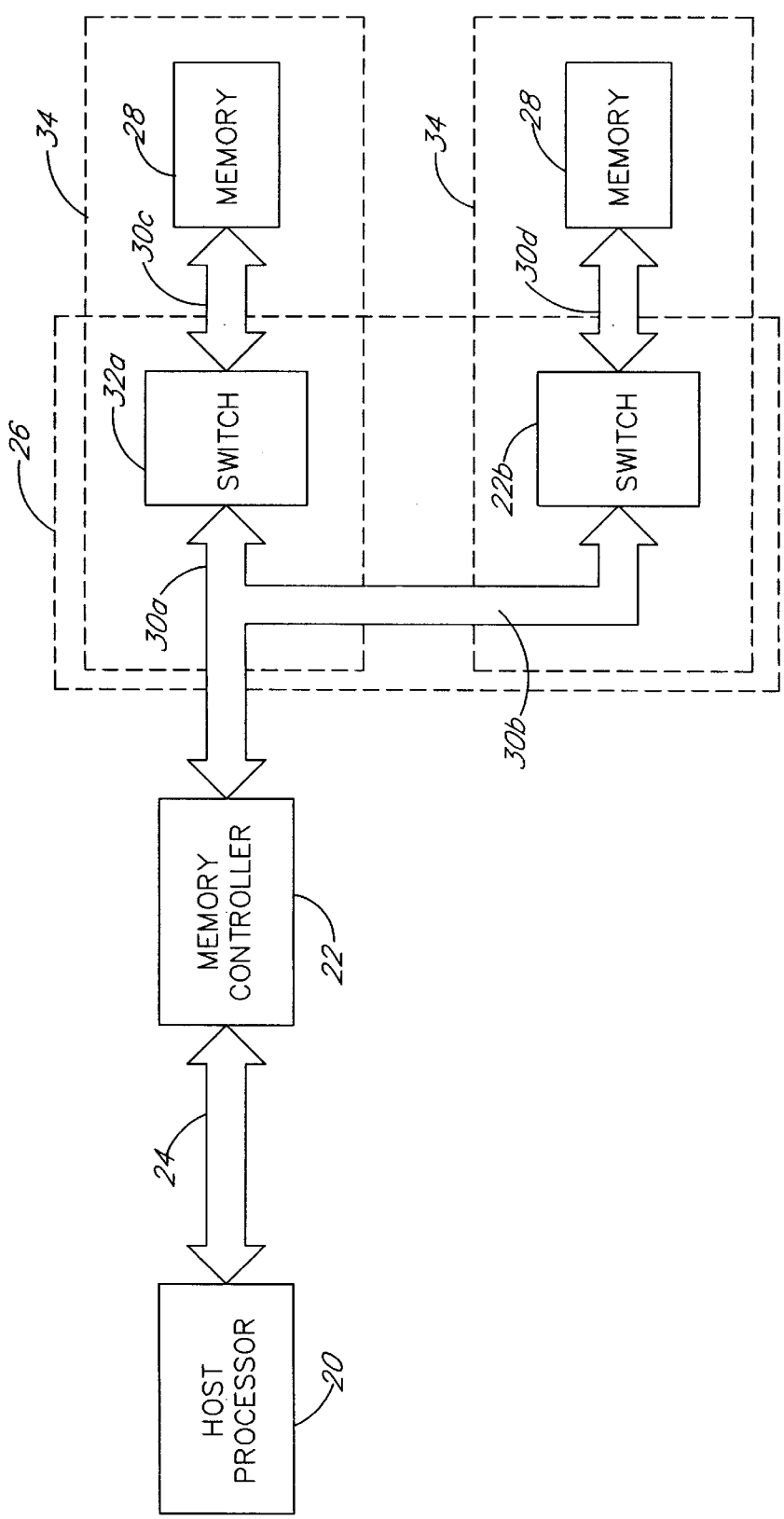
FIG. 3 is a block diagram of a computing system incorporating an embodiment of the invention.

FIG. 3 illustrates one embodiment of a computing system incorporating the invention. As shown in this Figure, the system includes a host processor 20 which in one embodiment of the invention comprises a microprocessor such as the X86 or Pentium(TM) families from Intel Corporation. Any digital data processing circuitry may, however, comprise the host processor 20 of FIG. 3, including digital signal processors, microcontrollers, multi-processor systems, etc. The host processor 20 may interface with a memory controller 22. The memory controller interface circuitry includes a data bus 24 for the transfer of digital data between the memory controller 22 and the host processor 20. Additional circuitry including control and address buses also connect between the host processor 20 and memory controller 22, but these are not illustrated in FIG. 3.

The memory controller 22 connects to circuitry 26 for interfacing with one or more memory circuits 28, two of which are illustrated in FIG. 3. This interface circuitry 26 also includes a data bus 30a–d for the transfer of data between the memory circuits 28 and the memory controller 22. As illustrated in FIG. 3, the data bus between the memory controller 22 and memory elements 28 may comprise several branches 30a, 30b, one for each of the separate memory elements 28. Each branch may include a switch 32a, 32b that, as will be explained in detail below, may be used to selectively isolate portions or segments 30c, 30d of the data bus running from the memory controller to the memory circuitry 28. It can be appreciated that by turning the switches 32a and 32b on or off, one or the other memory circuit 28 may be removed from the data bus. For example, when the host processor requires data in the memory circuit 28 connected to bus segment 30c, switch 32a may be switched on, while switch 32b may be switched off. Thus, the design of FIG. 3 may reduce the parasitic capacitance that the memory controller needs to charge and discharge during data transfers because a portion of the data bus and the stray capacitance of unaccessed memory circuits are removed.

Figure 4:
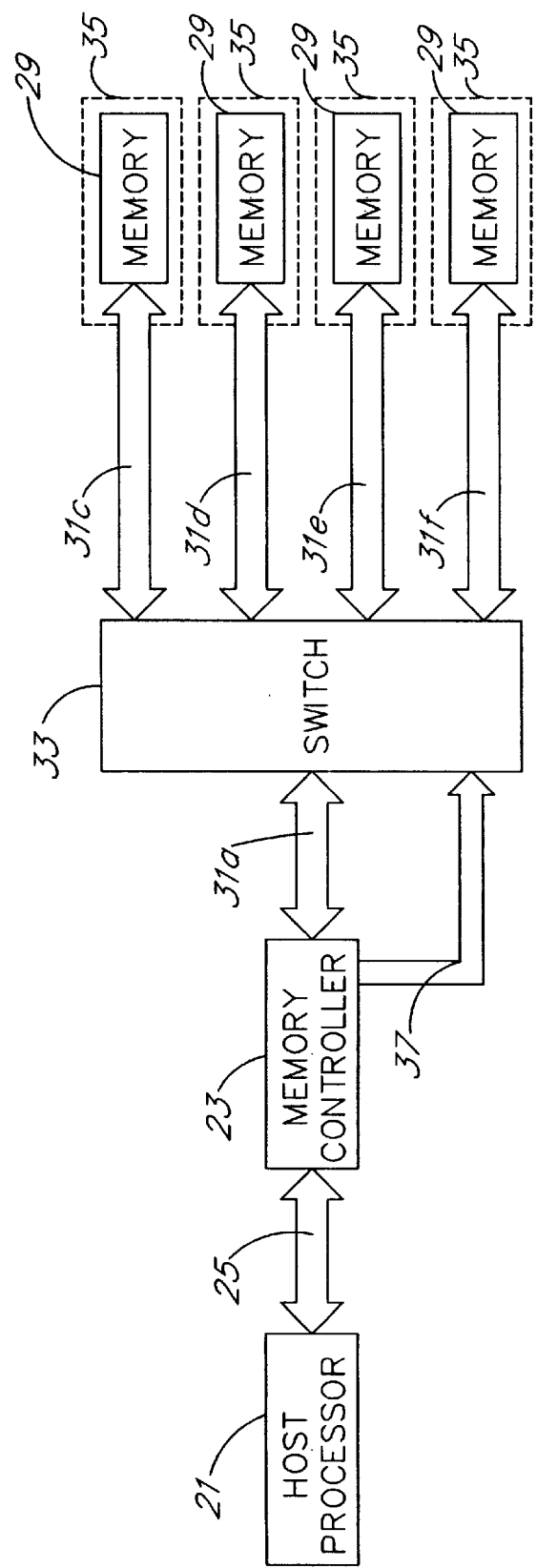
FIG. 4 is a block diagram of a computing system incorporating another embodiment of the invention.

It will also be appreciated that although the host processor 20, memory controller 22, bus switches 32a and 32b, and memory 28 are illustrated as separate circuit blocks, various combinations could be placed on a single integrated circuit (IC). In one embodiment applicable to current personal computer designs, the host processor and memory controller are secured to a motherboard as separate integrated circuits. The memory circuit may be a conventional dynamic random access memory (DRAM) integrated circuit (IC). The DRAM IC may be part of a memory module 34 which also incorporates a separate IC forming the bus switch. The memory module may be a standard SIMM or DIMM style as are well known in the art, wherein the DRAM and bus switch are soldered to a printed circuit board which also includes contacts for interfacing with a mating motherboard connector. In other embodiments, the switch is incorporated into the DRAM IC. In addition, the memory controller may be part of the host processor IC. It is also contemplated that all of the circuitry shown in FIG. 3 may be placed on a single IC, or may be provided in a multi-chip package. In another advantageous embodiment illustrated in FIG. 4, a host processor 21 interfaces with a memory controller 23 via a bus 25 in a manner analogous to that shown and described with reference to FIG. 3. Memory elements 29 are also provided in this system. In one common application, the host processor 21 and memory controller 23 are separate integrated circuits mounted on a personal computer motherboard along with a plurality of conventional DIMM or SIMM style DRAM memory modules 35 with DRAM memory integrated circuits 29 mounted thereon. Also provided in the embodiment of FIG. 4 is a bus switch 27 which splits a single input data bus 31a from the memory controller into a plurality of output data buses 31c, 31d, 31e, 31f which are routed to the respective memory modules 35. It can thus be appreciated that in the FIG. 4 embodiment, the switch 27 includes the interface circuitry 26 illustrated in FIG. 3. In the personal computer motherboard environment referred to above, the bus switch 27 may comprise another separate integrated circuit mounted to the motherboard. This integrated circuit may, for example, comprise a plurality of the switches illustrated in FIG. 2. In this embodiment, the input side 17 of each of the four would be commonly connected to the input data bus 31a, and the output sides 16 would each be separately routed to one of the output data buses 31c, 31d, 31e, and 31f. Therefore, selectively asserting the corresponding four TE signal inputs would selectively couple the input data bus 31a to one of the output buses 31c, 31d, 31e, or 31f.

As shown in FIG. 4, the memory controller 23 may include a control output 37 which controls the bus switch 27 so as to connect the input data bus 31a to one of the output buses 31c, 31d, 31e, and 31f while the remaining three output buses remain disconnected from the input bus. It can be appreciated that during memory accesses, the memory controller 23 will therefore only need to drive one bus and memory module rather than all of them during each memory access as is the current state of the art.

Because given computer systems may have different numbers of memory modules installed, it is convenient to design a memory controller which is easily configurable to handle alternative system memory sizes. In one embodiment, therefore, the control bus is two bits wide, and the memory controller is configurable to output an encoded four state output signal (i.e. 00, 01, 10, or 11) for selecting one of four banks, or a decoded two state signal (i.e. 01 or 10) for selecting between two memory banks. In the first case, the switch 27 may include four switches and a demultiplexer for selecting one of the TE signal inputs to assert based on the value of the received four state control signal. In the second case, the switch 27 may include only two switches, wherein the TE control inputs of the switch are driven directly with the respective lines of the two state output. The same core memory controller logic circuit can thus be configured for use in both large and small systems. Of course, it will be appreciated that the control output 37 may comprise an encoded or decoded signal of more than two output lines. The number of control output signals required may be determined by the number of separate memory elements in a given computer system.

Figure 5:
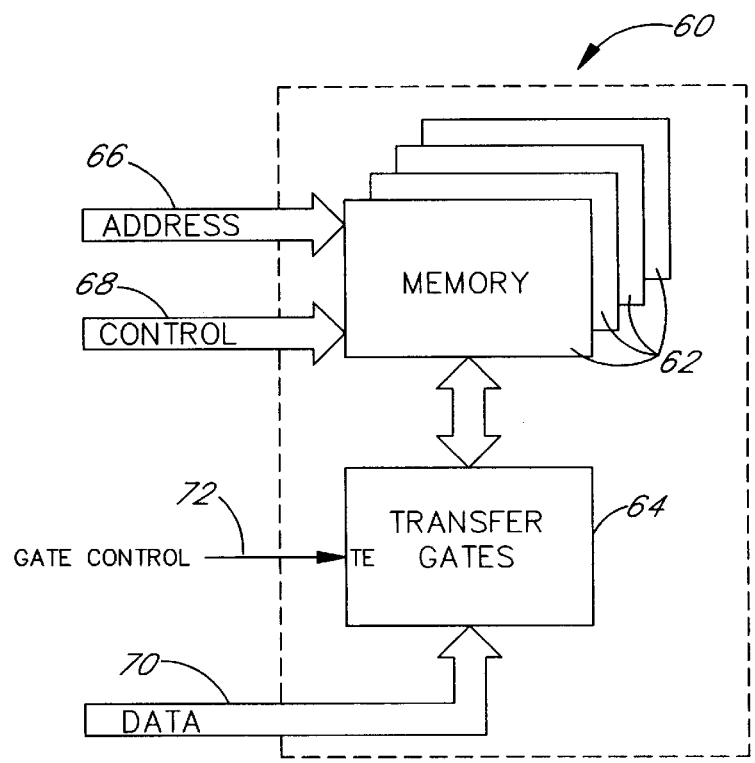
FIG. 5 is a block diagram of one embodiment of a memory subsystem incorporating the present invention.

It will also be appreciated that the switch and switch control circuitry of the present invention may be provided on a memory module itself, rather than on a motherboard. Thus, FIG. 5 illustrates one embodiment of a DRAM memory module 60 manufactured in accordance with the invention. The memory module 60 includes one or more memory elements 62, each of which may comprise a memory integrated circuit, which is mounted on a printed circuit board (not illustrated). Also mounted on the printed circuit board is a set of transfer gates 64, which may be constructed as illustrated in FIG. 2. As in conventional in memory modules, the module 60 includes electrical contacts for connection to an address bus 66, control lines 68, and a data bus 70. The control signals 68 may include a row address strobe (RAS), column address strobe (CAS) and write enable (WE) familiar to those in the art, for example.

The data input electrical contacts of the memory module are connected by the data bus 70 to inputs on the transfer gates 64. Outputs of the transfer gates 64 are connected to the memory elements 62. As explained above with reference to FIGS. 1 and 2, the transfer gates are a type of bus switch in the data bus 70. The transfer gates 64 may remain closed when the memory module is not being accessed by the host processor, and may be opened when a memory access is being performed.

Referring again to FIG. 5, a gate control signal 72 may also be routed to another electrical contact on the memory module 60 from logic circuitry which is external to the module 60. This gate control signal 72 may be asserted whenever data is to be written to or read from the module 60. In systems with several modules, a different gate control signal will be routed to each module to selectively open the appropriate transfer gate for memory accesses from the various memory modules of the system.

Figure 6:
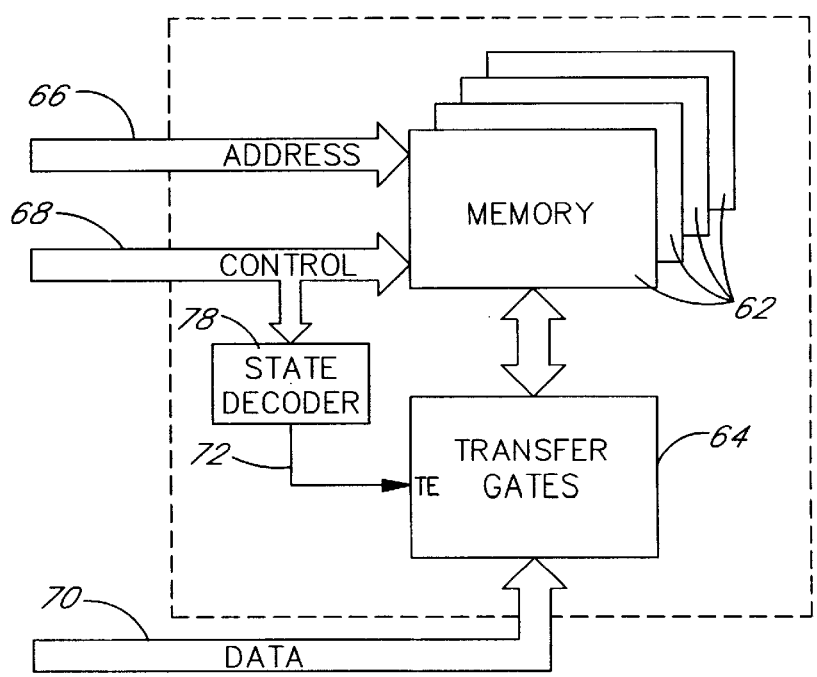
FIG. 6 is a block diagram of another embodiment of a memory subsystem incorporating the present invention.

FIG. 6 illustrates another embodiment of a memory module incorporating the invention. In analogy with the embodiment of FIG. 5, The memory module 76 of FIG. 6 also includes memory elements 62, a set of transfer gates 64, and electrical contacts to interface with an address bus 66, control lines 68, and a data bus 70. In the embodiment of FIG. 6, however, the gate control signal 72 is not routed from external logic circuitry to an additional electrical contact on the module. Instead, a state decoder 78 is provided on the module 76. The state decoder may comprise a programmable logic device, for example. As inputs, the state decoder 78 receives one or more of the control signals which are received from the host system. The state decoder 78 has the gate control signal 72 as an output. The state decoder 78 decodes the signals on the control lines to determine whether or not a memory access to or from the module is being made, and asserts the gate control signal 72 to open the transfer gates 64 when a memory access is being made. This embodiment has the advantage that no unconventional signal line for gate control needs to be created and routed to the memory module. Thus, a memory module as shown in FIG. 6 could be placed in existing, conventional memory applications such as personal computer applications without any modification of a DRAM to memory controller interface.

Figure 8:
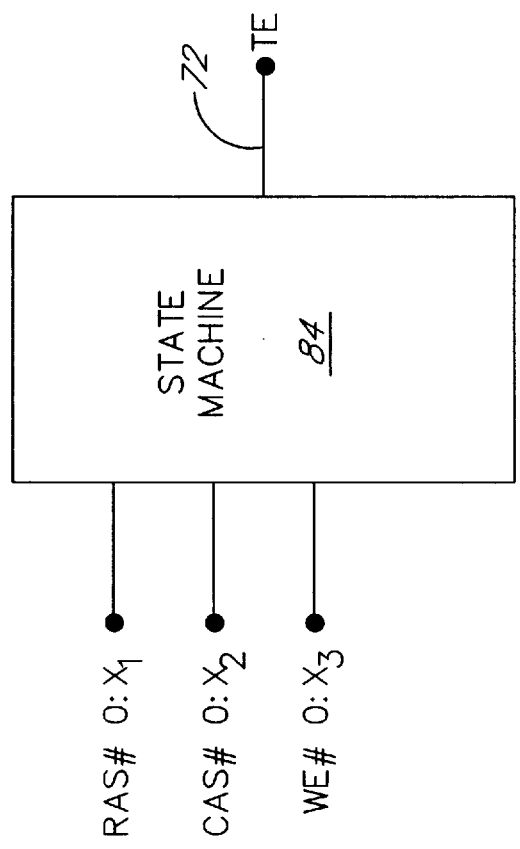
FIG. 8 is an illustration of another embodiment of a memory cycle decoder for controlling a transfer gate.
Figure 7:
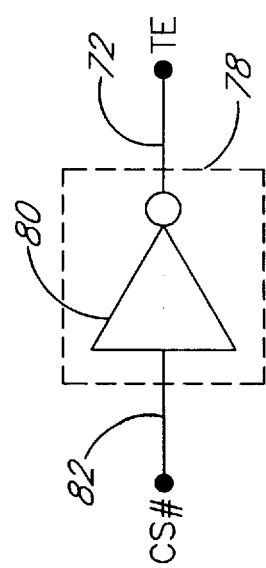
FIG. 7 is an illustration of one embodiment of a memory cycle decoder for controlling a transfer gate.
Figure 9:
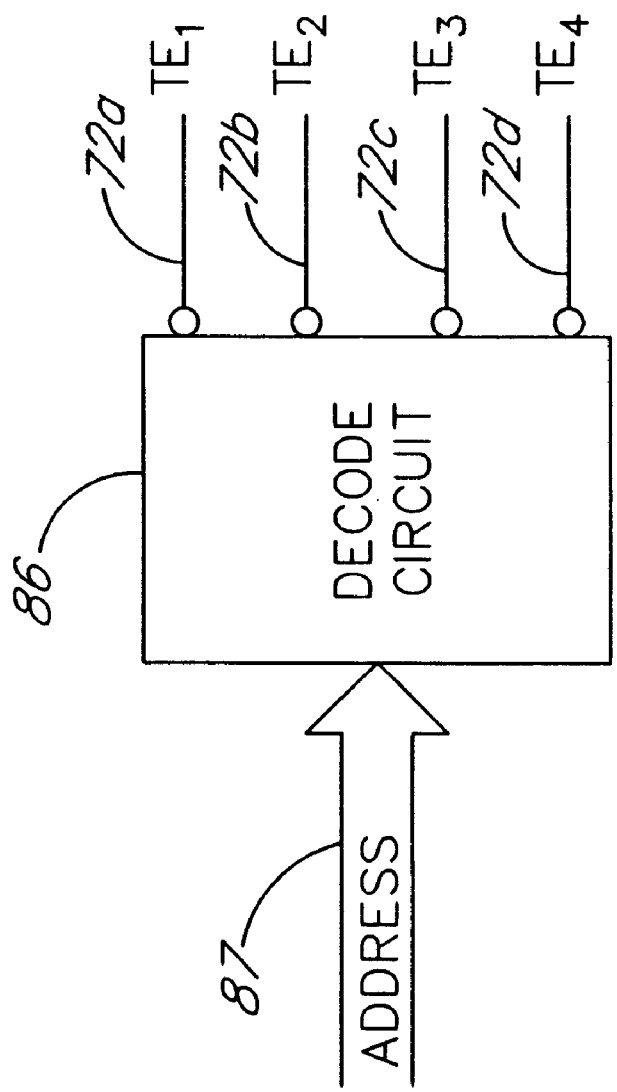
FIG. 9 is an illustration of a third embodiment of a memory cycle decoder for controlling a transfer gate.

Specific implementations of decoders for creating the necessary TE control signals are illustrated in FIGS. 7, 8, and 9. Referring now to FIG. 7, a state decoder 78 could comprise an inverter 80 which has as an input a chip select signal 82 which is asserted low. In this embodiment, the transfer gates 64 would be as shown in FIG. 2, and would be in the on state when the output of the inverter went high. This may be appropriate when applying the invention to synchronous-DRAM memory modules, where a chip select signal is commonly used.

Referring now to FIG. 8, more complicated state decoders may be desirable where the chip select input to the module is always asserted, and therefore the other memory control signals must be used to determine the status of memory access. In this case, the state decoder 78 could comprise a state machine 84 made with a programmable gate array for example. The state machine 84 would have inputs comprising RAS, CAS, and WE. As is known, there may be several of each of these signals, depending on the architecture of the memory module. The state machine 84 will determine the status of memory accesses, and appropriately assert the gate control signal 72 when data transfer is to occur.

FIG. 9 illustrates another decoder embodiment which may advantageously be used when the decoder is part of a memory controller as illustrated in FIG. 4. In this case, the address to be accessed selected by the host processor will identify which memory module 35 is to be accessed. In this decoder embodiment, selected bits of the address to be accessed are sent on a bus 87 to a decode circuit 86. The decode circuit 86 then selectively asserts the appropriate TE signal in response to the address bits on output lines 72a, 72b, 72c, and 72d. Although illustrated as four decoded outputs in FIG. 9, one of skill in the art will readily be able to decode the memory access addresses to produce the encoded two bit signal described above with regard to FIG. 4, or to produce other configurations of encoded or decoded outputs depending the desired application and bus switch configuration.

Figure 10:
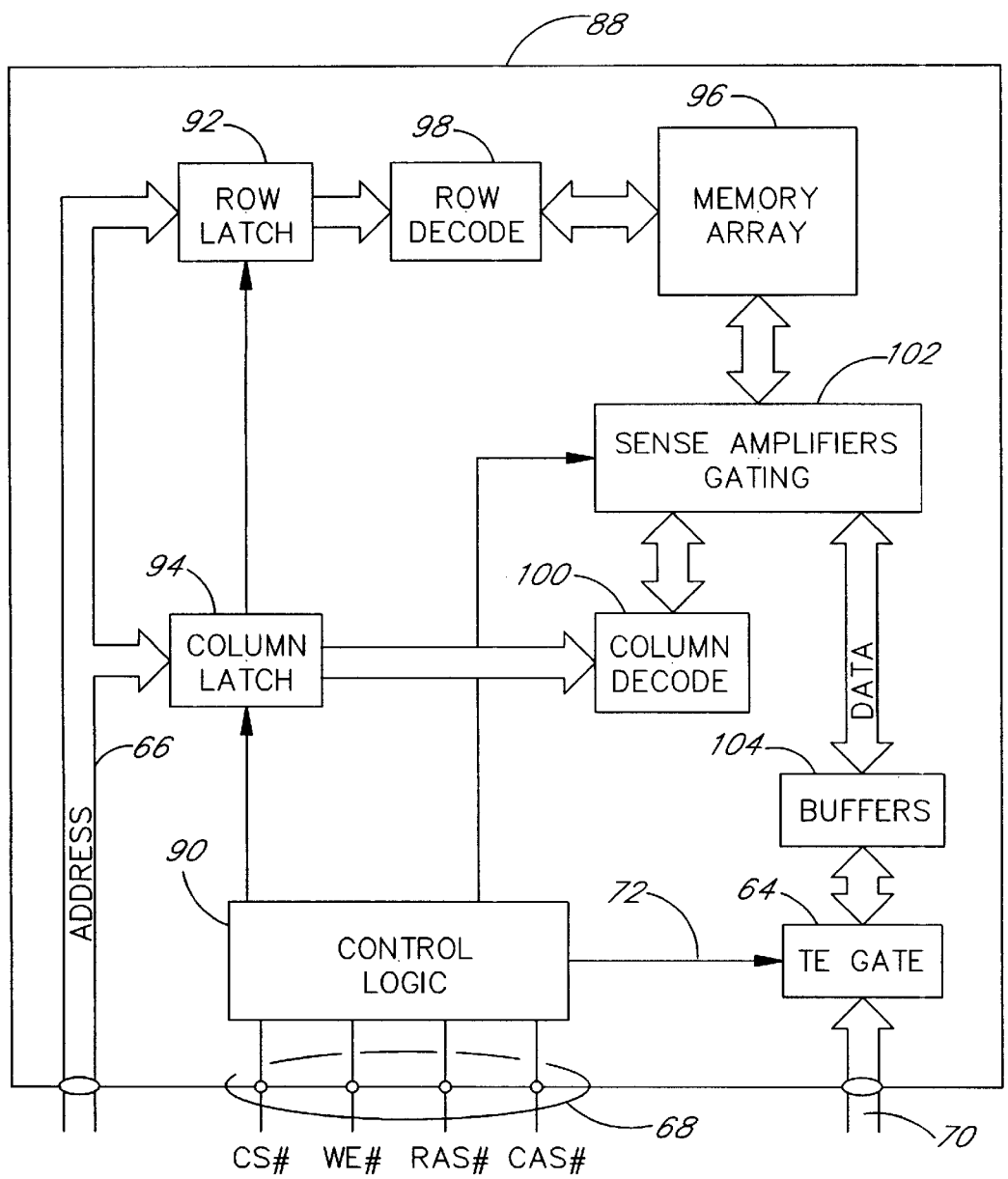
FIG. 10 is a block diagram of one embodiment of a memory integrated circuit incorporating the present invention.

It may also be noted that bus switch and associated control circuitry may alternatively be incorporated into a memory integrated circuit. One embodiment of this is illustrated in FIG. 10. The memory integrated circuit 88 of FIG. 10 includes input terminals for the address bus 66 and data bus 70. Also, control lines 68 are connected to control logic circuitry 90 on the chip. As in conventional memory integrated circuits, the row and column addresses are input to a row latch 92 and column latch 94 respectively. These addresses are presented to a memory array 96 via a row decoder 98 and a column decoder 100. Sense amplifiers and gating circuitry 102 route data into and out of the memory array. This data is routed through input and output buffers 104 provided between the memory array 96, and the data bus terminals of the memory integrated circuit 88.

In this embodiment of the invention, a transfer gate input is connected to the data bus contacts on the integrated circuit 88, and a transfer gate output is connected to data buffer registers. The control logic 90 can be made to additionally include the state decoder circuitry 78 described above with reference to FIG. 6. Thus, the transfer gate 64 is off when no memory access is occurring, and is on when data is being transferred between the integrated circuit 88 and the host system.

The invention may be embodied in other specific forms without departing from its spirit or essential characteristics. The described embodiment is to be considered in all respects only as illustrative an not restrictive and the scope of the invention is, therefore, indicated by the appended claims rather than by the foregoing descriptions. All charges which come within the meaning and range of equivalency of the claims are to be embraced within their scope.

What is claimed is:

1. A memory module comprising:
   a printed circuit board;
   at least one electrical contact arranged on said printed circuit board to receive digital data;
   at least one synchronous-DRAM memory integrated circuit attached to said printed circuit board;
   a state decoder for receiving a chip select signal targeted for the synchronous-DRAM memory circuit; and
   at least one switch having one or more inputs connected to corresponding ones of said one or more electrical contacts, and one or more outputs connected to said at least one memory integrated circuit, whereby the synchronous-DRAM memory integrated circuit is selectively decoupled from a bus in response to a change in state in the chip select signal.

2. A memory module comprising:
   a printed circuit board;
   at least one electrical contact arranged on said printed circuit board to receive digital data;
   at least one memory integrated circuit attached to said printed circuit board;
   a state decoder for receiving a chip select signal targeted for the memory circuit; and
   at least one switch having one or more inputs connected to corresponding ones of said one or more electrical contacts, and one or more outputs connected to said at least one memory integrated circuit, whereby the memory integrated circuit is selectively decoupled from a bus in response to a change in state in the chip select signal.

3. The memory module of claim 2, wherein said switch additionally comprises a control portion for selectively opening and closing said switch.

4. The memory module of claim 2, wherein said control portion is coupled to an additional electrical contact on said printed circuit board.

5. The memory module of claim 2, additionally comprising:
   electrical contacts arranged on said printed circuit board for receiving memory access control signals; and
   a logic circuit having an input coupled to at least one of said electrical contacts, and having an output coupled to said control portion of said switch.

6. A memory module comprising:
   a printed circuit board having a data bus;
   at least one electrical contact arranged on said printed circuit board to receive digital data;
   at least one memory integrated circuit attached to said printed circuit board; and
   at least one switch having one or more inputs connected to corresponding ones of said one or more electrical contacts, and one or more outputs connected to said at least one memory integrated circuit, and wherein activation of the switch is operated to control the parasitic capacitance of the bus.

7. The memory module of claim 6, wherein said switch additionally comprises a control portion for selectively opening and closing said switch.

8. The memory module of claim 6, wherein said control portion is coupled to an additional electrical contact on said printed circuit board.

9. The memory module of claim 6, additionally comprising:
   electrical contacts arranged on said printed circuit board for receiving memory access control signals; and
   a logic circuit having an input coupled to at least one of said electrical contacts, and having an output coupled to said control portion of said switch.

10. A memory module comprising:
    a printed circuit board comprising a data bus; and
    at least one memory integrated circuit attached to said printed circuit board, the memory integrated circuit comprising at least one switch for decoupling the memory integrated circuit from the data bus, and wherein activation of the switch is operated to control the parasitic capacitance of the bus.

11. The memory module of claim 10, wherein said switch additionally comprises a control portion for selectively opening and closing said switch.

12. The memory module of claim 10, wherein said control portion is coupled to an additional electrical contact on said printed circuit board.

13. The memory module of claim 10, additionally comprising:
    electrical contacts arranged on said printed circuit board for receiving memory access control signals; and
    a logic circuit having an input coupled to at least one of said electrical contacts, and having an output coupled to said control portion of said switch.

14. A memory module comprising:
    a printed circuit board;
    at least one electrical contact arranged on said printed circuit board to receive digital data;
    a memory controller comprising an address bit decoder configured to selectively enable one or more memory controller outputs in response to received address bits;

at least one memory integrated circuit attached to said printed circuit board; and at least one switch in a databus that is resides at least in part in the memory integrated circuit, wherein the switch, the memory integrated circuit, and the memory controller each collectively reside within a single integrated circuit, and wherein activation of the switch is operated to control the parasitic capacitance of the bus.

15. The memory module of claim 14, wherein said switch additionally comprises a control portion for selectively opening and closing said switch.

16. The memory module of claim 14, wherein said control portion is coupled to an additional electrical contact on said printed circuit board.

17. The memory module of claim 14, additionally comprising:

electrical contacts arranged on said printed circuit board for receiving memory access control signals; and a logic circuit having an input coupled to at least one of said electrical contacts, and having an output coupled to said control portion of said switch.

* * * * *

UNITED STATES PATENT AND TRADEMARK OFFICE
CERTIFICATE OF CORRECTION

PATENT NO.   : 6,587,363 B2
DATED        : July 1, 2003
INVENTOR(S)  : Dean A. Klein It is certified that error appears in the above-identified patent and that said Letters Patent is hereby corrected as shown below:

<u>Title page,</u>
Item [73], please replace the Assignee "Micron Electronics, Inc., Nampa, ID" with -- Micron Technology, Inc., Boise, ID --.

Signed and Sealed this

Sixteenth Day of September, 2003

JAMES E. ROGAN
*Director of the United States Patent and Trademark Office*